United States Patent
Camp, Jr. et al.

(10) Patent No.: US 6,236,214 B1
(45) Date of Patent: May 22, 2001

(54) METHOD AND APPARATUS FOR DETERMINING THE REMAINING OPERATION TIME OF A MOBILE COMMUNICATION UNIT

(75) Inventors: William O. Camp, Jr., Chapel Hill; Chris Turner; I. Nelson Wakefield, both of Cary, all of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/471,603

(22) Filed: Dec. 23, 1999

(51) Int. Cl.[7] ............................. G01N 27/416; H02J 7/00
(52) U.S. Cl. ............................. 324/427; 320/132
(58) Field of Search ............................. 324/427; 320/132, 320/106, 110

(56) References Cited

U.S. PATENT DOCUMENTS

| | | | |
|---|---|---|---|
| 4,803,416 | * | 2/1989 | Abiven et al. ........................ 320/132 |
| 5,561,362 | * | 10/1996 | Kawamura ........................... 320/134 |
| 5,955,869 | * | 9/1999 | Rathmann ............................ 320/132 |
| 6,005,367 | * | 7/1998 | Rhode ................................. 320/106 |
| 6,025,695 | * | 2/2000 | Friel et al. .......................... 320/106 |
| 6,037,749 | * | 3/2000 | Parsonage ........................... 324/427 |

* cited by examiner

Primary Examiner—Peter S. Wong
Assistant Examiner—Pia Tibbits
(74) Attorney, Agent, or Firm—Wood, Phillips, VanSanten, Clark & Mortimer (57) ABSTRACT

A method and apparatus for determining the capacity in a battery-powered communication. The method includes the steps of measuring a temperature of the battery, measuring a charging voltage and current, and determining a value corresponding to the number of charge cycles associated with the battery. Using these parameters, a capacity value corresponding to at least one of the parameters is computed based on stored database information. The apparatus includes a microprocessor linked to the battery. The microprocessor estimates the capacity present in the battery and calculates the remaining amount of battery capacity. After determining the present mode of battery power discharge, the microprocessor calculates the remaining available power time for the battery corresponding to previously read operational parameters.

27 Claims, 9 Drawing Sheets

RELATIONSHIP OF CHARGE IN BATTERY, CHARGING VOLTAGE AND CHARGING CURRENT

Fig. 3

RELATIONSHIP OF CHARGE IN BATTERY, CHARGING VOLTAGE AND CHARGING CURRENT AS A PARAMETER OF BATTERY TEMPERATURE

Fig. 4

RELATIONSHIP OF CHARGE IN BATTERY, CHARGING VOLTAGE AND CHARGING CURRENT VERSUS AGE (I.E., HIGH CHARGE/DISCHARGE CYCLE COUNT)

METHOD AND APPARATUS FOR DETERMINING THE REMAINING OPERATION TIME OF A MOBILE COMMUNICATION UNIT

BACKGROUND OF THE INVENTION

The present invention relates in general to power storage batteries. In particular, the present invention relates to a method and apparatus for estimating the charge present in a cellular telephone battery.

Cellular networks utilize ground-based transmission stations to transmit and receive modulated voice and paging signals to and from outlying mobile cellular telephone units. With the advent of more efficient and inexpensive mobile units, cellular networks have moved toward replacing conventional terrestrial networks. To consumers, cellular telephones are convenient because they may be used in remote areas without supplemental power or land-line connections. A handheld mobile unit's ability to transmit and receive signals effectively, however, depends significantly on dependable battery power within the unit. In order to increase the amount of useful battery power for cellular telephone mobile units, several battery technologies have been developed, including Nickel-Cadmium (Ni—Cd), Nickel Metal-Hydride (NiMH) and Lithium Ion (Li-Ion) chemistries. Each type of battery chemistry exhibits different charging and discharge characteristics and nominal voltages.

Useful battery power, or charge, is referred to in the present application as "ampere-hour capacity" or "capacity." This useful power is instilled into the battery during a charging cycle, wherein current is run through the battery and charge is accumulated therein. Ampere-hour capacity is the charge on a battery that can be delivered by the battery up to the limit to which the battery may be safely discharged. Battery capacity is measured in ampere-hours, which corresponds to the quantity of electricity obtained by integrating current flow in amperes over the time in hours for its flow.

For a typical cellular telephone battery, a finite amount of the battery capacity is available for use in the mobile unit "standby" mode. In this mode, the mobile unit is typically waiting for a call or a textual paging message. In this mode, the telephone may receive or transmit "superframes," which comprise sequences of modulated signal data of a specified bit length. All or a portion of this capacity may also be used for "talk" mode communications, wherein the user is linked with a base station and transmitting and receiving voice signals. This mode requires significant transmission power, and therefore almost always discharges the battery at a faster rate than the "standby" mode. For example, for a particular fully charged battery, the mobile unit may be able to operate in "standby" mode for a cumulative total of 75 hours, but may be able to operate in "talk" mode for a cumulative total of 3 hours. If the mobile unit is utilized in talk mode and standby mode at various instances in time, the total amount of available power time ("talk time" or "standby time") remaining will vary depending on the total amount of power discharged in the various modes.

It is desirable for the user to be informed as to how much talk time, standby time, or available, useful power time remains in a battery-operated communication device, such as a cellular phone, when the battery is being charged or in use. In the past, several methods have been used to indicate how much power is being deposited into or taken out of a battery. These methods, however, tended to magnify inaccuracies after a succession of charge/discharge cycles where the battery capacity measurement was not completely accurate.

Indeed, such inaccuracies often occurred because battery capacity is affected by many independent factors such as its power output rating, temperature, and age. For example, even though a cellular telephone battery is fully charged and would normally yield 90 minutes of talk time at room temperature, it may only power a mobile unit for 10 minutes if the battery temperature is −25 degrees Celsius. Moreover, a new battery may yield 90 minutes of talk time, while a battery with 200 or more charge/discharge cycles may yield only 70 minutes of talk time. Even the rate of discharge can affect the remaining capacity of the battery. For example, the remaining battery capacity available when the mobile unit is operating in "talk" mode may be 10% less than that available when the unit is operating in "standby" mode.

Therefore, there is a need for a method and apparatus for determining the capacity available in a battery in order to effectively communicate the amount of remaining usable time for the device to the user.

Furthermore, there is a need for a method and apparatus for determining this capacity based on the charge input into the battery.

SUMMARY OF THE INVENTION

In one aspect of the present invention, a method for estimating the capacity present in a battery is provided. The method includes the steps of measuring a temperature of the battery, measuring a charging voltage and current and determining a value corresponding to the number of charging cycles associated with the battery. Using these parameters, a capacity value corresponding to at least one of the parameters is computed based on stored database information.

In another aspect of the present invention implemented in a device such as a cellular telephone, the total amount of discharge for the battery may be calculated by determining the transmission rate of the telephone. Using database information specific to a particular battery chemistry and configuration, the amount of discharge attributable to each mode or transmission rate is calculated. The total usage attributable to all rates of transmission for each mode may then be utilized to accurately convert the remaining available battery capacity to the remaining talk time and standby time for the battery.

The invention may also be embodied in an apparatus for determining the available power time for a battery-powered communication. The apparatus includes a microprocessor linked to the battery. The microprocessor estimates the capacity present in the battery and calculates the remaining amount of capacity. After determining the present rate of battery charge, the microprocessor calculates the remaining amount of time that sufficient battery power will be available from the battery corresponding to previously read operational parameters. The apparatus may also include a display in communication with the battery for displaying the calculated remaining "talk" or "standby" time to a user.

It is to be understood that both the foregoing general description and the following detailed description are exemplary and explanatory and are intended to provide further explanation of the invention as claimed.

BRIEF DESCRIPTION OF SEVERAL VIEWS OF THE DRAWINGS

A more complete understanding of the structure and operation of the present invention may be achieved by reference to the following detailed description in conjunction with the accompanying drawings, wherein.

DETAILED DESCRIPTION OF THE INVENTION

Figure 1:
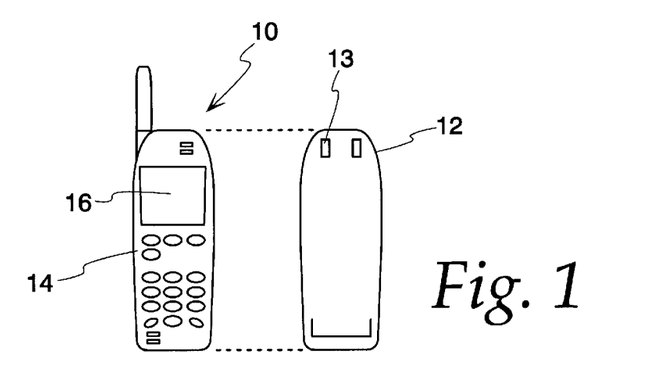
FIG. 1 is a block diagram showing a handheld mobile unit implementing one or more preferred embodiments of the present invention.

The preferred embodiment of the present invention preferably may be utilized in a handheld mobile unit or cellular mobile unit 10 as shown in the diagram of FIG. 1. In the alternative, any portable, battery-powered communication device may implement the present invention in the disclosed or modified form. As shown in the Figure, the mobile unit 10 includes a detachable battery unit 12 having electrical contacts 13 registrable with the rear of the mobile unit 10. A standard cellular telephone keypad 14 and display 16 are located on the face of the unit and operate as a user interface with the functions of the mobile unit 10.

The cellular mobile unit battery 12 is preferably rechargeable and may be of several known types. For example, the battery 12 may include Nickel-Cadmium (Ni—Cd) chemistry components. Ni—Cd batteries typically have a nominal voltage of approximately 1.2 volts. The battery 12 may also be of the Nickel Metal Hydride (NiMH) chemistry, which has a nominal voltage of approximately 1.2 volts. In the preferred embodiment, the battery 12 is a Lithium Ion battery (Li-Ion) which has a nominal voltage of approximately 3.7 volts.

Figure 2:
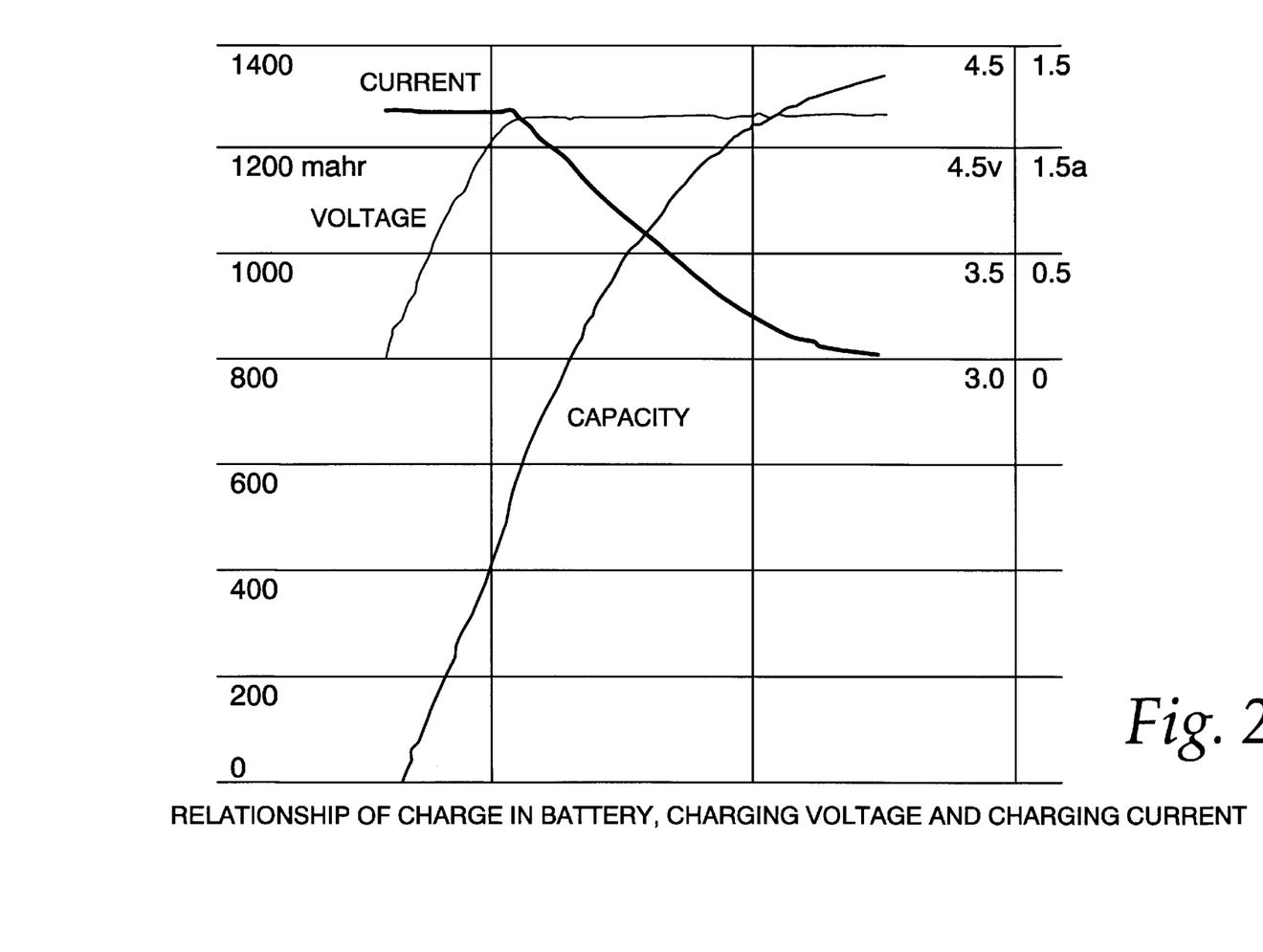
FIG. 2 is a graphical chart of data showing the relationship of battery charge, charging voltage and charging current utilized in one or more preferred embodiments of the present invention.

The preferred embodiment of the invention informs the user of the useful capacity remaining or present in a cellular mobile unit battery by taking into account various factors that affect the battery capacity. For example, FIG. 2 shows plot curves for battery capacity, voltage and current for a typical Li-ion battery of the preferred embodiment. The capacity of the battery is measured in milliamp-hours (mahr), and the current in milliamps. The charging current and charging voltage are the current and voltage supplied to the battery 12 during the recharging operation. As shown in the plot of FIG. 2, the measurement of voltage and charging current for the preferred Li-Ion battery uniquely specify the charge on the battery. The plotted curves change with battery temperature and the accumulated number of charging and discharging cycles made to the battery during its lifetime. The data from these plots may be stored as data or interpolated from data stored in nonvolatile memory in the preferred embodiment, as will be discussed in more detail below.

Figure 3:
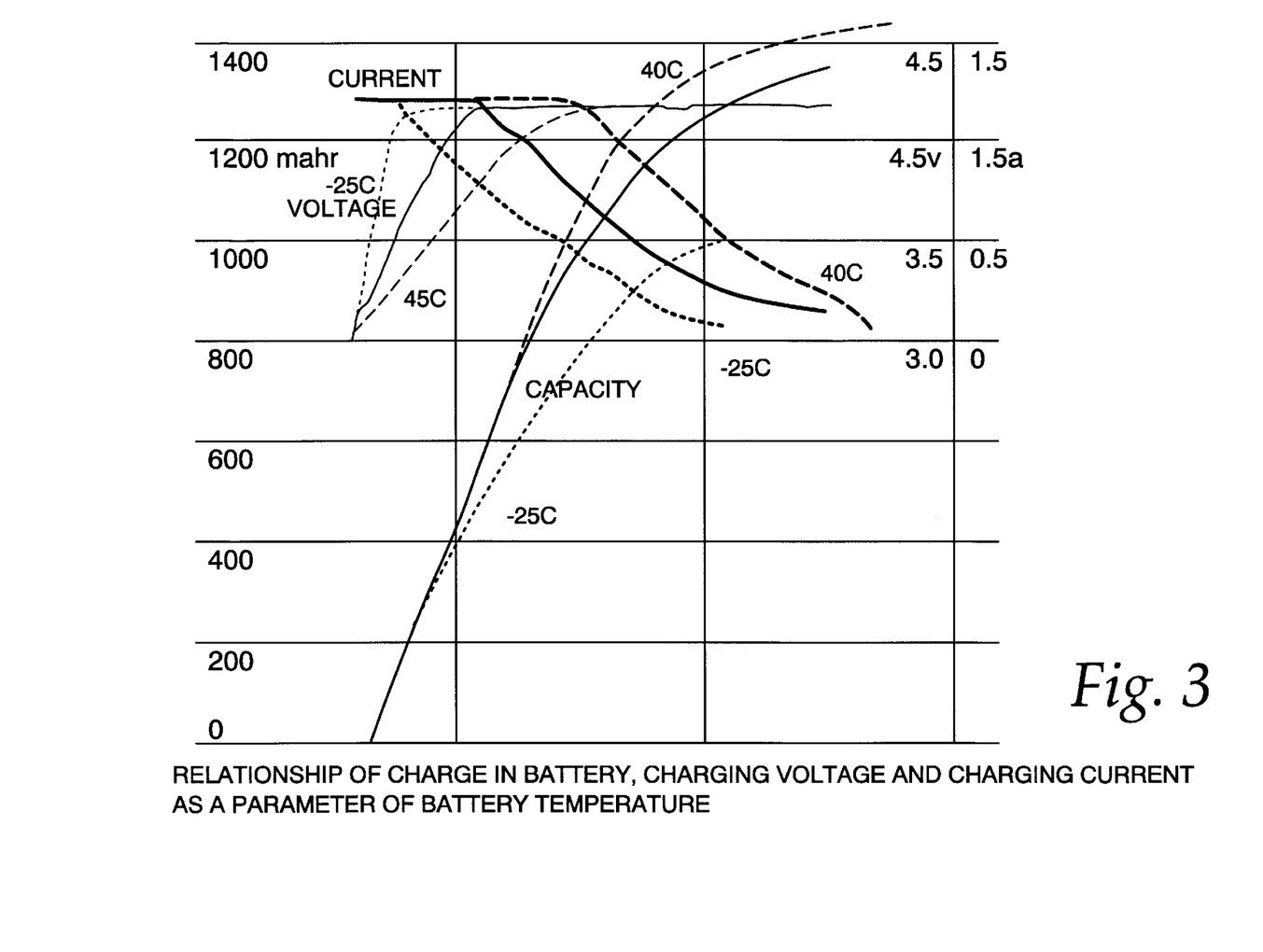
FIG. 3 is a graphical chart of data showing the relationship of battery charge, charging voltage and charging current as a parameter of battery temperature as utilized in one or more preferred embodiments of the present invention.

The effect of temperature on the battery capacity is shown in the charging curves of FIG. 3. In particular, the relationship of the charge contained in the battery, the charging voltage and the charging current are plotted as a parameter of battery temperature. In this Figure, a moderately constant increase in battery capacity occurs as the temperature of the battery is increased between −25 and 40 degrees Celsius. As with the data from the curves shown in FIG. 2, the data from these curves are stored in non-volatile memory in the preferred embodiment.

Figure 4:
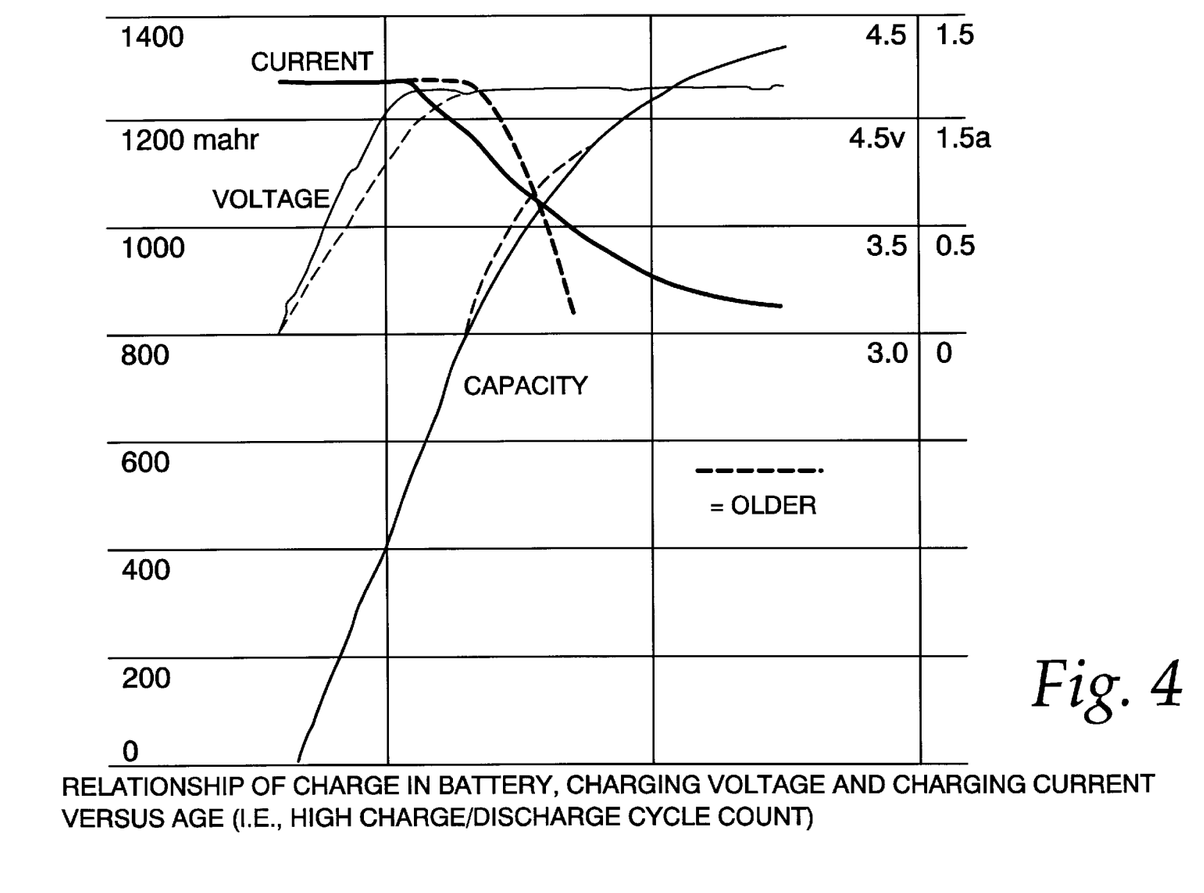
FIG. 4 is a graphical chart of data showing the relationship of battery charge, charging voltage and charging current versus the age of the battery as utilized in one or more preferred embodiments of the present invention.

The preferred embodiment of the present invention preferably also accounts for the "age" of the battery. In particular, the number of charge/discharge cycles that a particular battery has undergone is taken into account when determining the battery charge. FIG. 4 shows how the capacity of the battery is affected by the number of charge/discharge cycles experienced by the battery. As shown in the Figure, the dashed lines represent a high number of charge/discharge cycles. The battery capacity is shown to be significantly decreased with increased battery age.

The above factors are taken into account by a first preferred embodiment of the present invention, which comprises a method of determining the capacity of a cellular mobile unit battery such as the battery 12 shown in FIG. 1.

Figure 5:
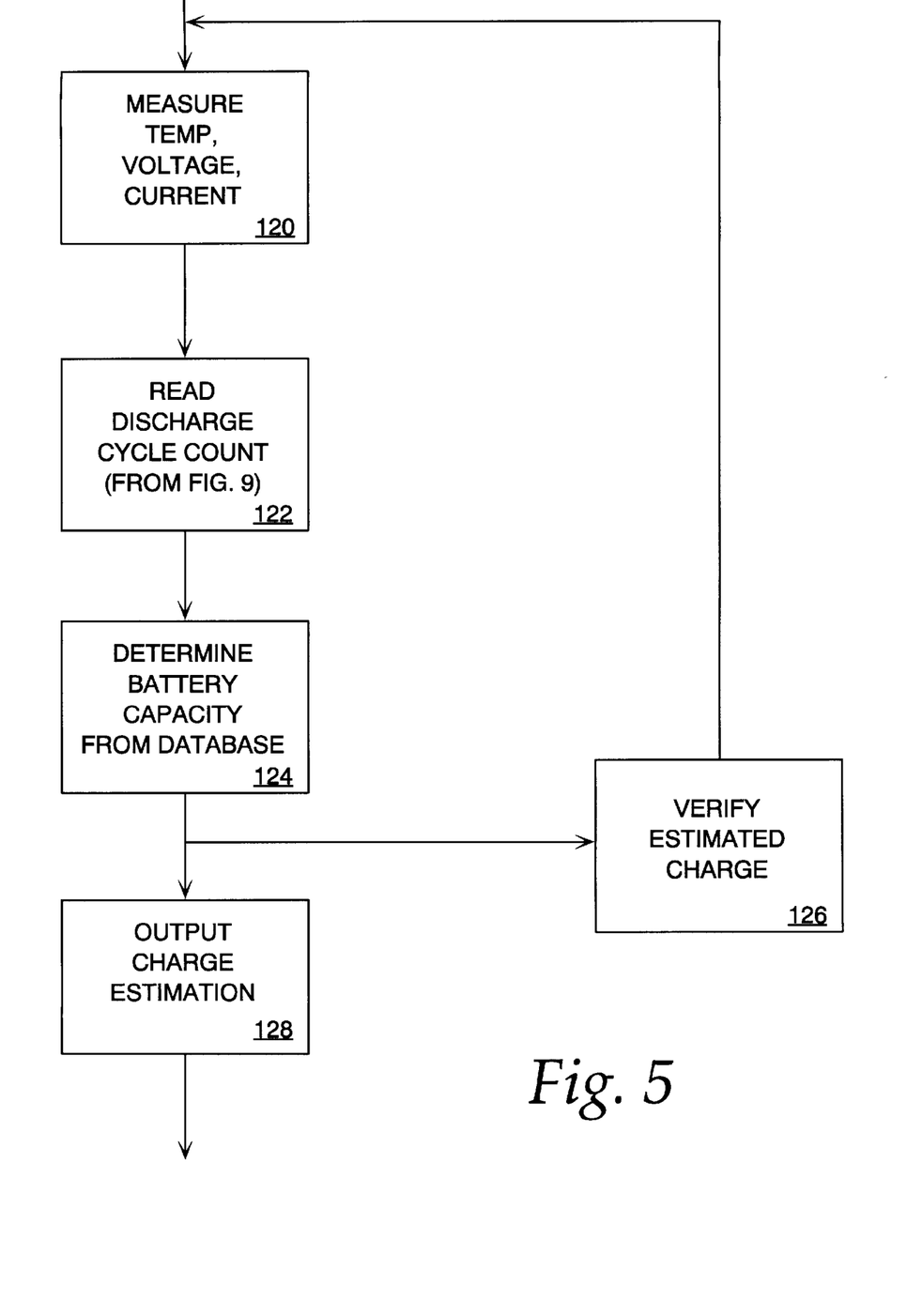
FIG. 5 is a flow diagram showing a preferred embodiment of the method of the present invention.

A flow diagram showing the general steps of the present invention is shown in FIG. 5, which depicts the process of capacity determination during charging. As shown in the Figure at box 120, the temperature of the battery 12 is first measured by a conventional thermocouple device. The output battery voltage and charging current are also measured and recorded, through conventional means. Next, the "age" of the battery 12 is determined by reading the number of charge/discharge cycles experienced by the particular battery, as shown at box 122. Preferably, the number of cycles is recorded in a memory or register contained within the battery 12, and remains in non-volatile memory throughout the useful life of the battery.

After the temperature, voltage, current and cycle readings are taken, a corresponding battery capacity is interpolated by determining the corresponding values from FIGS. 3 and 4. Preferably, the data from the plots are contained in a database of information stored in memory for rapid retrieval by the logic implementing the present embodiment. For example, the capacity in the battery 12 may be estimated by determining a battery capacity value corresponding to a point on a capacity curve, wherein the curve takes into account the battery temperature and charge/discharge cycles a shown in FIGS. 3 and 4.

As shown in box 126, the estimated capacity may be verified if the battery 12 has been completely discharged during its most recent discharge cycle. This optional step of verification may be implemented in procedural steps wherein the known charging current is multiplied by the known time the battery is charged. The result of this operation should closely match the estimate output from box 124.

Whether or not the optional verification step shown in box 126 is performed on the estimated battery capacity, the determination performed in box 124 is output at box 128. The output may be supplied directly to the user of the mobile unit or placed into a discharge estimation algorithm as described below.

Figure 6:
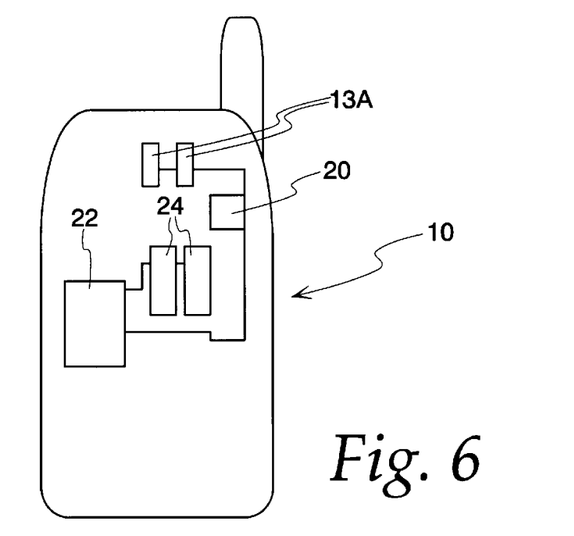
FIG. 6 is a block diagram showing the components of another preferred embodiment of the present invention.

The presently preferred embodiment is implemented in an apparatus as shown in FIG. 6. In the preferred embodiment of the invention, the battery temperature is sensed by a standard thermocouple device 20 as shown in FIG. 6. The thermocouple device 20 is located adjacent the battery 12 in the cellular mobile unit 10. The temperature samples and other readings are preferably measured and coordinated by a microprocessor 22 contained within the mobile unit 10. The microprocessor 22 may be any commonly available microprocessor for processing signals or binary data. FIG. 6 further shows the memory or registers 24 linked to the microprocessor 22, thermocouple 20 and battery contact sensors 13A. Of course, the present disclosure is not meant to be limiting, and other known methods for implementing the method of the presently preferred embodiment may be used. For example, logic may be implemented in a standard EPROM device housed within the mobile unit 10, or a software or firmware routine may be programmed into the memory 24.

The present invention and preferred embodiment thereof may incorporate a method for estimating the discharge of the battery 12 to provide more precise battery drain and remaining power information to the user. The amount of discharge may be converted into indicators which display the available time left for the powered communication, such as "remaining talk time" or "remaining standby time" display indicators. In order to calculate the remaining talk or standby time present in the battery, the amount of capacity remaining in the battery should be known. In the present embodiment, a capacity value may be obtained through operation of the method of the first preferred embodiment as shown in the routine of FIG. 5. The discharging current draw available to the mobile unit 10 must also be known. While typical cellular mobile units operate in a number of modes, the two modes having the most significant differences in power consumption are "talk" and "standby" modes. Thus, a cellular mobile unit operating in "standby" mode will consume considerably less power for a given unit of time than a mobile unit operating in "talk" mode.

Figure 7:
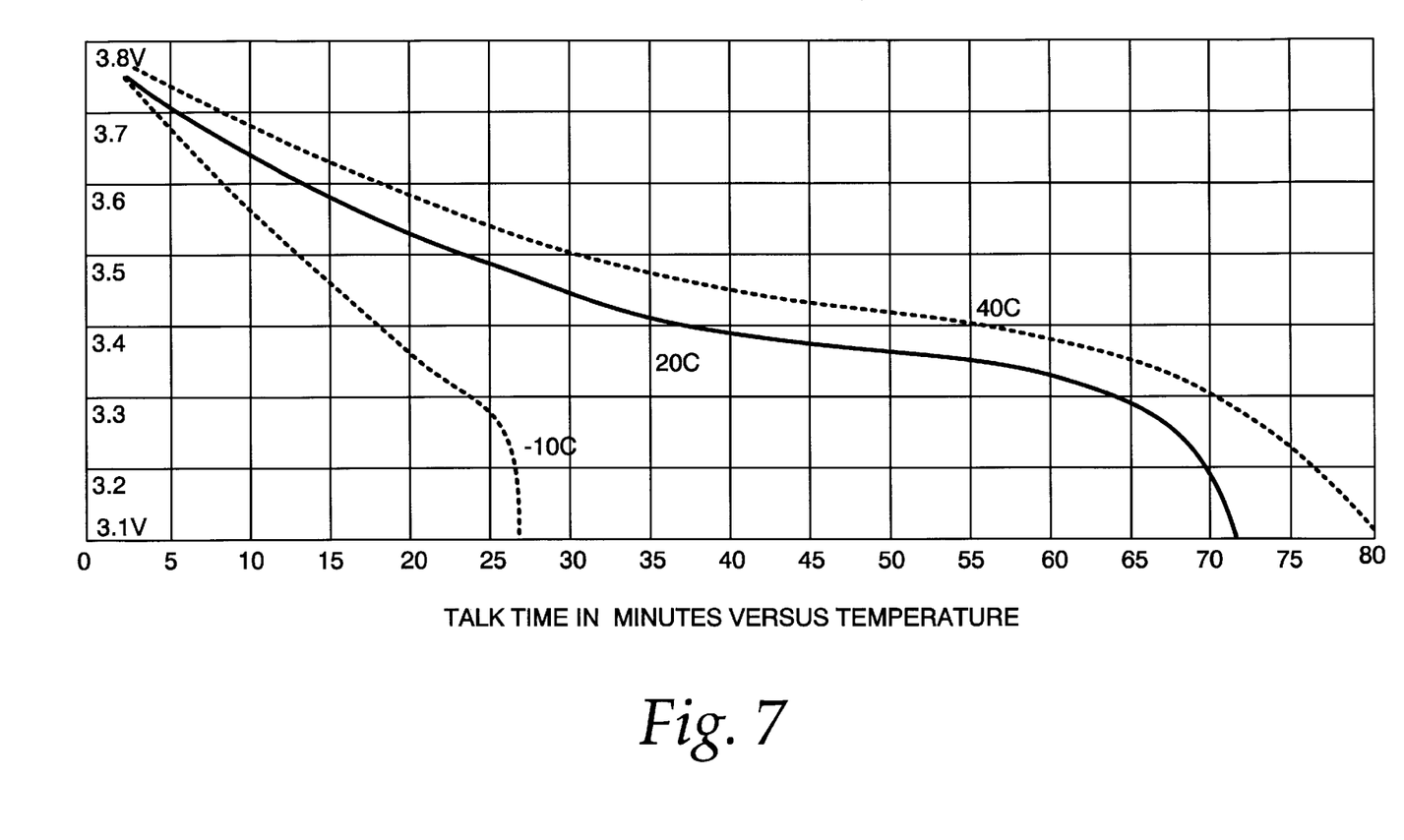
FIG. 7 is a graphical chart of data showing the relationship between talk time versus battery temperature as utilized in one or more preferred embodiments of the present invention.

As discussed briefly above, the most significant factor affecting the amount of talk time or standby time present in a charged battery is the temperature of the battery. As shown in the plotted curves of FIG. 7, the amount of power or talk time remaining in a battery is significantly decreased as the temperature decreases. The present embodiment of the invention takes all of these factors into account. Thus, as the system keeps track of the current and capacity removed from the battery, the amount of talk time may be recalculated in accordance with any temperature changes for the battery. This provides more accurate talk and standby time information to the user.

Figure 8:
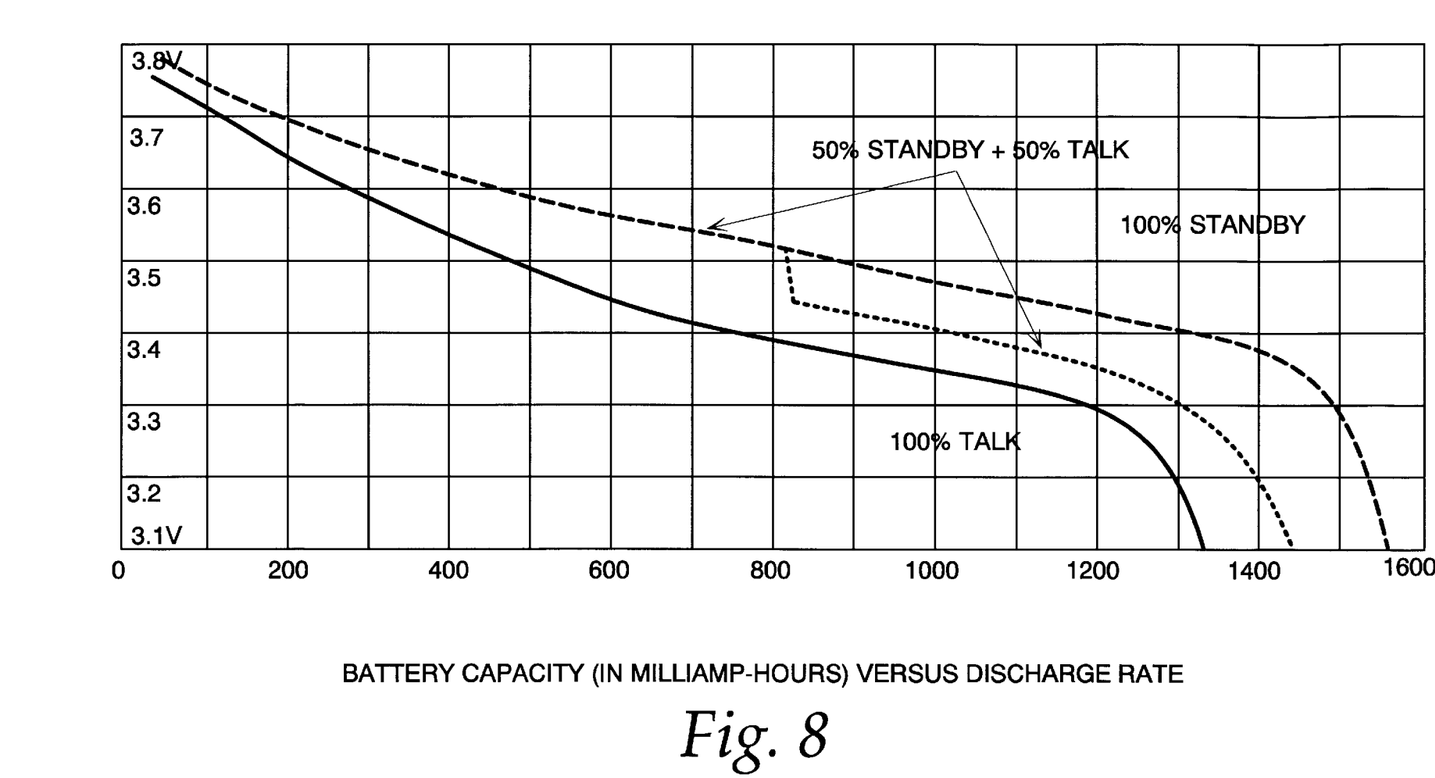
FIG. 8 is a graphical chart of data showing the relationship between battery capacity versus discharge rate as utilized in one or more preferred embodiments of the present invention.

A second factor that significantly affects the remaining talk and standby time in a battery is the battery discharge rate. As shown in the plotted curves of FIG. 8, the capacity of a battery decreases with the higher discharge rate associated with the mobile unit operating in "talk" mode. This is a cumulative effect with each charge/discharge cycle. For example, a battery discharged by 50% in "standby" mode will have more remaining talk time than a battery discharged more rapidly by 50% in "talk" mode.

In order to keep track of the total time spent in either "talk" or "standby" mode between recharge cycles, the second preferred embodiment of the present invention incorporates a method of recording the time spent in either mode.

Figure 9:
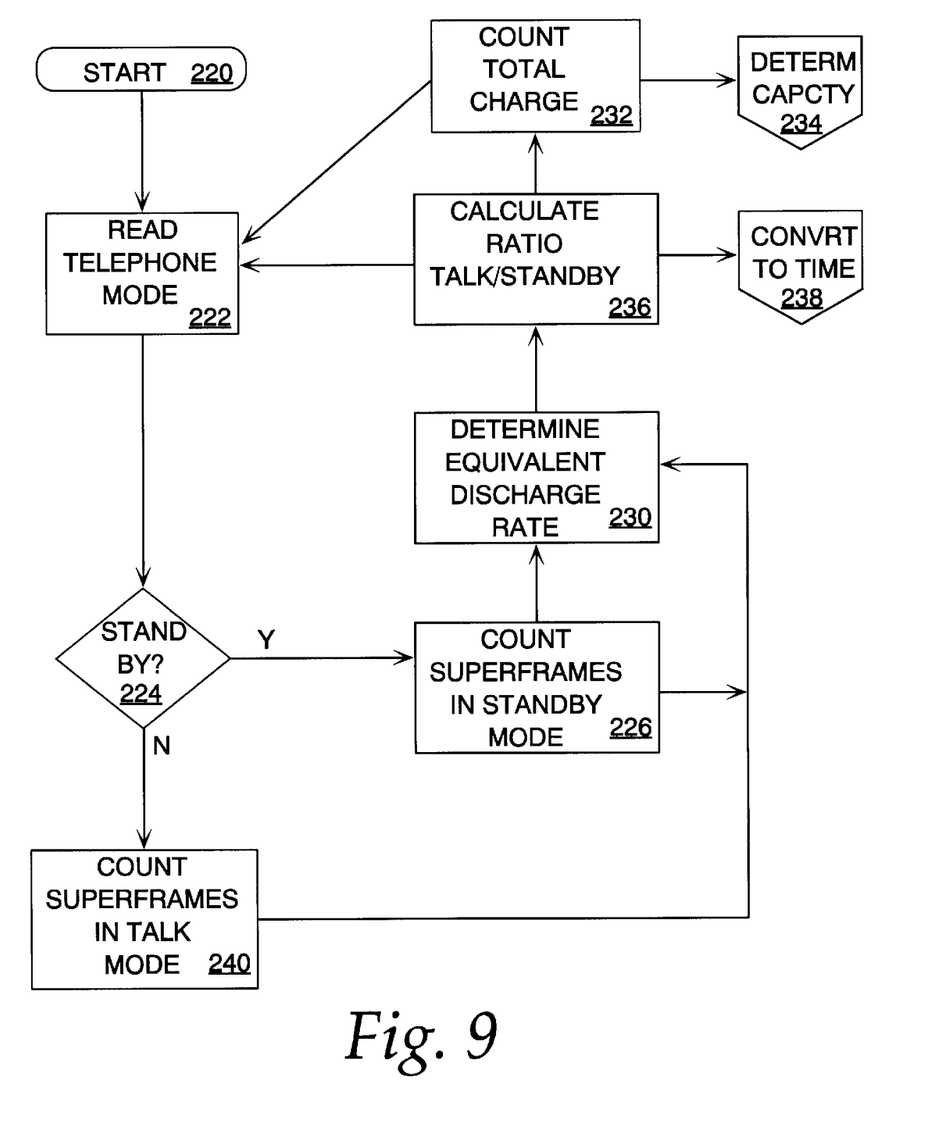
FIG. 9 is a flow diagram showing another preferred embodiment of the method of the present invention.

The method of the second preferred embodiment is shown in the flow diagram of FIG. 9. The routine shown in the Figure is used to determine the total amount of time spent in each mode during operation of the cellular mobile unit. As the routine begins at box 220, the mode of operation of the mobile unit is read at box 222. If the mobile unit is determined at 224 to be in a "standby" or low power consumption mode, a register containing the total amount of usage time attributable to a "standby" mode is updated at 226.

If the mobile unit is determined to be in "talk" mode at box 224, a separate register representing the amount of time spent in "talk" mode is updated at box 240.

At box 236, the ratio of discharge time or removed capacity attributable to "talk" mode to the discharge time attributable to "standby" mode is calculated using the register data obtained in boxes 240 and 226, respectively, in conjunction with the time equivalent computational step 230. The ratio is used to calculate the amount of true "talk" or "standby" time remaining in the battery as explained in conjunction with FIG. 10 below. In the alternative, if a non-talk mode device is used, the remaining "power time" or useful operating time may be calculated.

At the same time as the ratio is being calculated, the total amount of removed capacity attributable to both "talk" and "standby" time is computed at box 232 by summing the counts made at boxes 226 and 240 in conjunction with the time equivalent computational step 230. These summing steps may be performed by a register or set of registers in communication with the phone microprocessor 22. The total removed charge computed at box 232 may then be sent at step 234 to the procedure explained above in conjunction with FIG. 5 to compute the estimation of capacity remaining in the battery. In particular, the total capacity may be read by the routine of FIG. 5 at box 128 shown in the Figure.

The hardware implementing the method shown above may be similar or identical to that shown in the implementation of the charge estimation routine discussed above and in FIG. 6. In this regard, the microprocessor 22 and associated registers 24 may be contained within the mobile unit 10 or within the battery housing itself. In the latter case, the hardware components may more easily track the condition of particular batteries, especially when single batteries are used among several mobile units.

Figure 10:
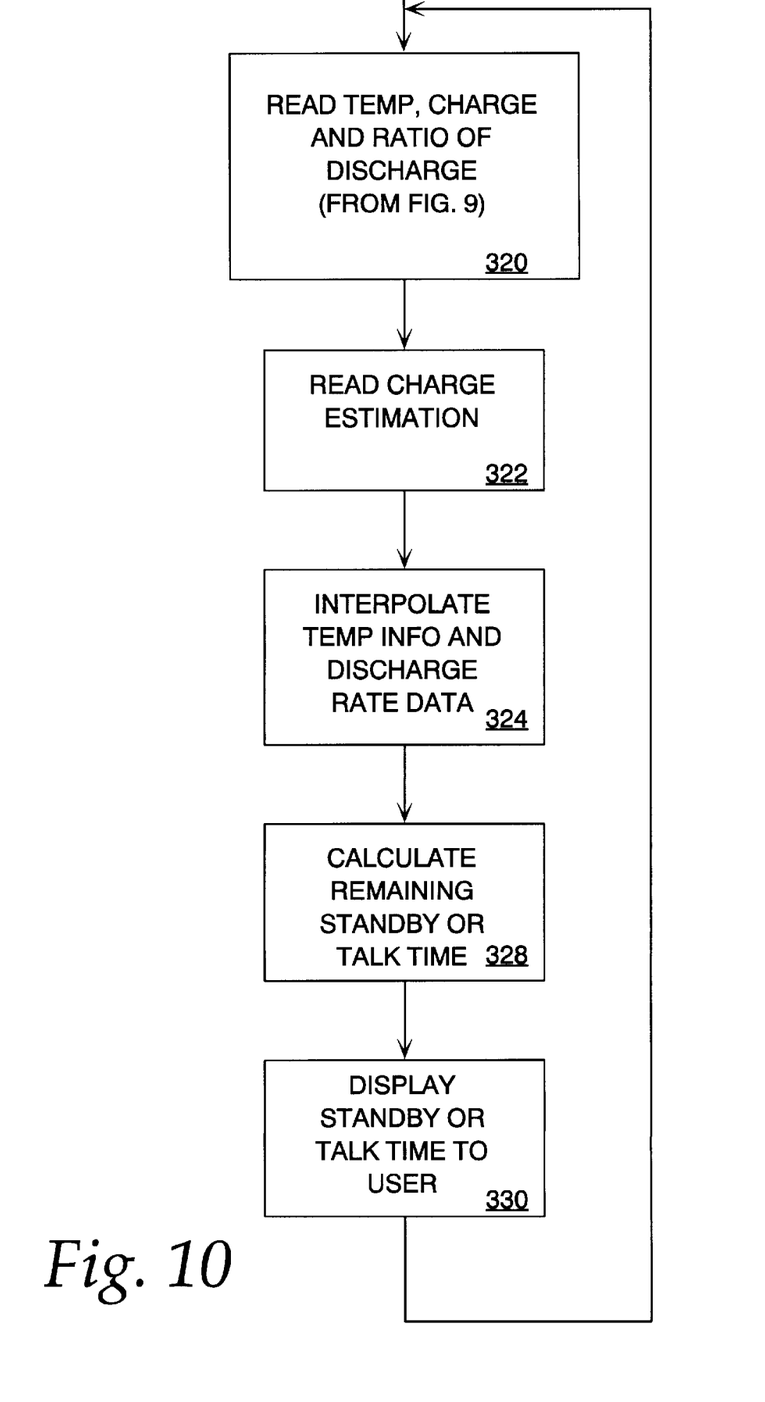
FIG. 10 is a flow diagram showing mother preferred embodiment of the method of the present invention.

Once the temperature and accumulated charge in the battery is computed, the sampled information may be converted to the remaining "standby" time and "talk" time for the battery. A preferred embodiment of the conversion routine is shown in FIG. 10. As shown in the Figure at box 320, the battery temperature is first measured. The capacity estimation at 322 is read from step 128 in the capacity estimation routine of FIG. 5.

At box 324, the routine correlates the battery parameters with data stored in a database. The database preferably contains data corresponding to values in plots similar to those shown in FIG. 7. Specifically, the total amount of removed capacity in the battery is subtracted from the estimated capacity contained in the battery. The discharge ratio between "talk" time discharge and "standby" time discharge may be obtained and interpolated with the appropriate curve data in the chart of FIG. 8 to obtain a new value for the battery capacity. As shown in box 328, using the new battery capacity value, the battery temperature parameter is then correlated with an interpolated data curve in the Figure to determine a corresponding amount of talk time remaining in the battery. Finally, the remaining "talk" or "standby" time is displayed to the user at box 330.

Figure 11:
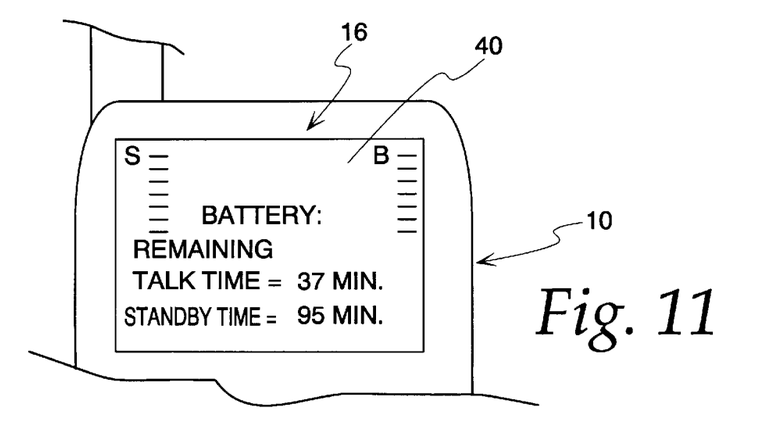
FIG. 11 is a block diagram showing a detailed view of the apparatus shown in FIG. 1 implementing the present invention.

FIG. 11 shows an exemplary bar graph display 40 on display screen 16 of the cellular mobile unit 10. As shown in the Figure, the display 16 can display both remaining "standby" and "talk" time at the same time, or separately.

Other factors may affect the estimate of the battery capacity, such as the present rate of discharge, the specific chemistries used in batteries made by particular manufacturers, a self-discharge rate and the delay introduced between the time samples of temperature and discharge timing are taken and the results displayed. These factors may be accounted for through adjustments made by the microprocessor in conjunction with manufacturer or delay data stored in memory. For the purposes of the preferred embodiment described herein, however, these other factors will be considered minimal.

Note that the temperature of the battery will likely change as the battery is charging because the current flow through the battery and the chemical changes within the battery generate heat. Multiple temperature sampling and interpolation between the plotted curves may therefore be necessary to maintain readings having the highest degree of accuracy. Furthermore, as an alternative to interpolation of stored data, curves can be fit to data and only the coefficients of those curves stored and subsequently used to calculate the desired data. This reduces the amount of memory required.

Of course, it should be understood that a wide range of changes and modifications can be made to the embodiments described above. It is therefore intended that the foregoing detailed description be regarded as illustrative rather than limiting and that it be understood that it is the following claims, including all equivalents, which are intended to define the scope of this invention.

We claim:

1. In a mobile communication unit having a battery and operable in a desired battery powered mode of operation, a method of estimating a remaining operating capacity of the mobile communication unit in said desired mode of operation, said method comprising the steps of:
   measuring a charging current of said battery;
   measuring a voltage of said battery;
   estimating a capacity value representative of said operating capacity in said desired mode of operation corresponding to at least one of said charging current and voltage; and
   displaying said capacity value to a user.

2. The method of claim 1 further comprising the step of measuring a temperature value of said battery and estimating said capacity value corresponding to said at least one of said charging current, voltage and said temperature value.

3. The method of claim 2 further comprising the step of determining a value corresponding to the number of charging cycles associated with said battery and estimating a capacity value representative of said capacity corresponding to at least one of said temperature value, current, voltage and charge cycle value.

4. The method of claim 1 further comprising the step of determining a value corresponding to the number of charge cycles associated with said battery and estimating a capacity value representative of said capacity corresponding to at least one of said current, voltage and charge cycle value.

5. The method of claim 1 wherein said capacity value is talk time remaining for the mobile communication unit powered by said battery.

6. The method of claim 5 wherein said step of estimating a capacity value further comprises comparing at least one of said temperature value, said voltage, said current, and said number of charge cycles with a database to obtain a corresponding value for said capacity value.

7. The method of claim 1 wherein said mobile communication unit has a first and a second desired mode of operation having respectively a first and a second rate of discharge of said battery, and said method further comprises:
   recording an amount of discharge of said battery attributable to said first rate of discharge while operating the mobile communication unit in said first desired mode of operation over a representative time period;
   recording an amount of discharge of said battery attributable to said second rate of discharge while operating the mobile communication unit in said second desired mode of operation over said representative time period;
   calculating a ratio of said amounts of discharge over said representative time period; and
   modifying said capacity value in accordance with said ratio.

8. The method of claim 7 wherein said battery has an initial charge at the beginning of said representative time period, and said method includes estimating a remaining charge in said battery by subtracting said amounts of discharge from said initial charge of said battery.

9. The method of claim 8 further comprising the step of calculating a remaining time of operation in one of said first or second desired modes of operation by multiplying said remaining charge in said battery by said ratio.

10. The method of claim 7 further comprising representing one of said amounts of discharge by counting and recording superframes of operation of said mobile communication unit during said representative time period.

11. In a communication device powered by a battery having an initial capacity, a method of determining the remaining talk time available for battery-powered communication using said communication device, said method comprising the steps of:
   estimating the initial capacity present in said battery;
   calculating the total amount of discharge experienced by said battery during use;
   determining the capacity of said battery based on said total amount of discharge;
   determining the present mode of operation of said device; and
   calculating a remaining talk time value for said communication device corresponding to the current mode of operation of said device and the determined capacity of said battery.

12. The method of claim 11 further comprising the steps of:
   calculating a ratio of the amount of discharge from said battery attributable to a first rate of discharge and the amount of discharge from said battery attributable to a second rate of discharge; and
   modifying said remaining talk time value in accordance with said ratio.

13. The method of claim 12 wherein said step of estimating the capacity present in said battery further comprises the steps of:

measuring a temperature value of said battery;

measuring a voltage output value of said battery;

determining a value corresponding to the number of discharge cycles associated with said battery; and determining a capacity value representative of said capacity corresponding to at least one of said temperature value, voltage output value and discharge cycle value.

14. An apparatus for determining the remaining talk time available for a battery-powered handset having one or more modes of operation including a present mode of operation, said apparatus comprising:

a battery containing an initial charge capacity;

logic in communication with said handset for determining the present mode of operation of said handset; and a microprocessor linked to said battery and said logic, said microprocessor estimating said capacity during charging, calculating the total amount of discharge experienced by said battery during use, determining the capacity of said battery based on said total amount of discharge, and calculating a remaining talk time value for said battery corresponding to the present mode of operation of said device and the determined capacity of said battery.

15. The apparatus of claim 14 adapted for integration into a cellular telephone.

16. The apparatus of claim 15 wherein said capacity is estimated by determining a database value of capacity corresponding to a battery charging current and voltage.

17. The apparatus of claim 15 further comprising a sensor detecting a temperature of said battery.

18. The apparatus of claim 17 wherein said database value also corresponds to said temperature.

19. The apparatus of claim 18 further comprising a display linked to said microprocessor indicating said capacity of said battery to said user.

20. In a mobile communication unit operable in a desired mode of operation and including a battery, an apparatus for determining a remaining capacity of said mobile communication unit for operation powered by said battery in said desired mode of operation, said apparatus comprising:

a current monitor and a voltage monitor for measuring a charging current and voltage of said battery and providing output signals representing said current and voltage;

a processor for receiving said output signals from said current and voltage monitors, and for estimating said remaining capacity of said mobile communication unit for operation powered by said battery in said desired mode of operation; and a display device for indicating said remaining capacity to a user.

21. The apparatus of claim 20 further comprising a temperature monitor for measuring a temperature value of said battery, wherein said capacity value represents a value of said capacity corresponding to at least one of said charging current, voltage and said temperature value.

22. The apparatus of claim 20 further comprising a counter for determining a value corresponding to the number of charging cycles associated with said battery, wherein said capacity value represents a value of said capacity corresponding to at least one of said temperature value, current, voltage and charge cycle value.

23. The apparatus of claim 20 wherein said mobile communication unit has a first and a second desired mode of operation having respectively a first and a second rate of discharge of said battery, and said apparatus further comprising:

a database operatively connected to said monitors for recording an amount of discharge of said battery attributable to said first rate of discharge while operating the mobile communication unit in said first desired mode of operation over a representative time period, and for recording an amount of discharge of said battery attributable to said second rate of discharge while operating the mobile communication unit in said second desired mode of operation over said representative time period; and said processor is configured and operatively connected to said database for retrieving information stored in said database and calculating a ratio of said amounts of discharge over said representative time period, and modifying said capacity value in accordance with said ratio.

24. The apparatus of claim 23 wherein said battery has an initial charge at the beginning of said representative time period, and said processor is configured for estimating a remaining charge in said battery by subtracting said amounts of discharge from said initial charge of said battery.

25. The apparatus of claim 24 wherein said processor is further configured for calculating a remaining time of operation in one of said first or second desired modes of operation by multiplying said remaining charge in said battery by said ratio.

26. The apparatus of claim 23 including a superframe counter operatively connected to said database for counting and recording in said database a count of superframes of operation of said mobile communication unit in one of said desired modes during said representative time period, and said processor is configured to utilize said count of superframes as representative of said amount of discharge in calculating said ratio.

27. In a mobile communication unit having a battery inoperable at a rate of discharge for a number of superframes in a desired mode of operation, a method for estimating a value of removed battery capacity by multiplying the number of superframes of operation in said desired mode by the rate of discharge of said battery while said mobile communication unit is operating in said desired mode.

* * * * *